United States Patent
Shao et al.

(10) Patent No.: US 11,189,566 B2
(45) Date of Patent: Nov. 30, 2021

(54) TIGHT PITCH VIA STRUCTURES ENABLED BY ORTHOGONAL AND NON-ORTHOGONAL MERGED VIAS

(71) Applicant: INTERNATIONAL BUSINESS MACHINES CORPORATION, Armonk, NY (US)

(72) Inventors: Dongbing Shao, Wappingers Falls, NY (US); Lawrence A. Clevenger, Saratoga Springs, NY (US); Shyng-Tsong Chen, Rensselaer, NY (US); Hao Tang, Slingerlands, NY (US); Jing Sha, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 365 days.

(21) Appl. No.: 15/951,243

(22) Filed: Apr. 12, 2018

(65) Prior Publication Data
US 2019/0318989 A1    Oct. 17, 2019

(51) Int. Cl.
| | |
|---|---|
| *H01L 23/528* | (2006.01) |
| *H01L 23/522* | (2006.01) |
| *H01L 27/02* | (2006.01) |
| *H01L 21/768* | (2006.01) |
| *H01L 21/311* | (2006.01) |

(52) U.S. Cl.
CPC ...... *H01L 23/528* (2013.01); *H01L 21/31144* (2013.01); *H01L 21/76802* (2013.01); *H01L 21/76877* (2013.01); *H01L 23/5226* (2013.01); *H01L 27/0207* (2013.01)

(58) Field of Classification Search
CPC ............... H01L 23/528; H01L 23/5226; H01L 21/31144; H01L 21/76802; H01L 21/76877; H01L 27/0207
See application file for complete search history.

(56) References Cited

U.S. PATENT DOCUMENTS

| | | | |
|---|---|---|---|
| 6,274,409 B1 | 8/2001 | Choi | |
| 6,911,389 B2 | 6/2005 | Brennan et al. | |
| 8,198,188 B1 | 6/2012 | Pierrat | |
| 8,863,063 B2 | 10/2014 | Becker et al. | |
| 9,209,129 B2 | 12/2015 | Rieger et al. | |
| 2005/0151133 A1* | 7/2005 | Wei .................. | H01L 29/66772 257/66 |
| 2012/0199982 A1* | 8/2012 | Kikuchi ............ | H01L 21/76897 257/774 |

(Continued)

OTHER PUBLICATIONS

Song et al., "Redundant Via Insertion with Cut Optimization for Self-Aligned Double Patterning," Proceedings of the 2017 Great Lakes Symposium on Very Large Scale Integration. May 10-12, 2017. pp. 137-142.

*Primary Examiner* — Matthew E. Gordon
(74) *Attorney, Agent, or Firm* — Tutunjian & Bitetto, P.C.; L. Jeffrey Kelly

(57) ABSTRACT

In accordance with an embodiment of the present invention, a photolithographic mask is provided. The photolithographic mask includes at least one merged via pattern in the photolithographic mask for printing a merged via opening in a resist layer, wherein the at least one merged via pattern includes a compound shape having a first rectangular opening portion and a second rectangular opening portion that intersect at an angle.

20 Claims, 9 Drawing Sheets

(56) References Cited

U.S. PATENT DOCUMENTS

| | | | |
|---|---|---|---|
| 2014/0038412 A1* | 2/2014 | Hu | H01L 21/76811 438/689 |
| 2014/0367855 A1* | 12/2014 | Rieger | H01L 21/76877 257/741 |
| 2016/0049364 A1 | 2/2016 | Edelstein et al. | |
| 2017/0236751 A1 | 8/2017 | Park et al. | |

* cited by examiner

TIGHT PITCH VIA STRUCTURES ENABLED BY ORTHOGONAL AND NON-ORTHOGONAL MERGED VIAS

BACKGROUND

Technical Field

The present invention generally relates to laying out and forming vias utilizing orthogonal and non-orthogonal merged via openings, and more particularly to utilizing merged via photolithographic masks and printed merged via layouts that overcome corner rounding and design rule limitations by using orthogonal and non-orthogonal merged via openings.

Description of the Related Art

When preparing circuit layouts and their corresponding lithographic masks, integrated circuit designers may abide by predetermined parameters referred to as design rules. Design rule checking can confirm that the physical layout of a circuit or chip meets the specific parameters for the intended fabrication processes, and verifies the correctness of a lithographic mask set.

Design rules can include resolution constraints and alignment/overlap constraints. A width rule can be a resolution constraint that specifies the minimum width of any shape in the design. A spacing rule can be a resolution constraint that specifies a minimum distance between two adjacent objects. An enclosure rule can specify that an object of one type is to be covered by another object with some additional margin. An overlying and/or underlying metal layer, for example, may extend beyond the sides of a via or contact by a predetermined distance to ensure overlap after masking errors and process variations are taken into consideration. Similarly, a trench for a metallization layer may extend beyond an overlapping, perpendicular trench or metal line by a predetermined distance. The trenches and vias can also have critical dimensions that the features should not go below. These design rules may compensate for process variability, including registration errors in aligning a first lithography mask and a subsequent lithography mask. Design rule checking (DRC) is intended to achieve a high overall yield and reliability for a design.

Integrated circuits can include metal lines on different metallization layers and vias filled with conductive material between metal lines to form electrical connections. Semiconductor devices in an integrated circuit (IC) can be electrically connected through such metal lines and vias. These metal lines and vias can be formed by lithographic processes following the design rules. The spacing of the metal lines and vias can be determined by the design rules.

SUMMARY

In accordance with an embodiment of the present invention, a photolithographic mask is provided. The photolithographic mask includes at least one merged via pattern in the lithographic mask for printing a merged via opening in a resist layer, wherein the at least one merged via pattern includes a compound shape having a first rectangular opening portion and a second rectangular opening portion that intersect at an angle.

In accordance with another embodiment of the present invention, a back end of line metallization interconnect structure is provided. The back end of line metallization interconnect structure includes a first wire segment in a first metallization layer, and a second wire segment in a second metallization layer, wherein the end of the second wire segment is above the end of the first wire segment, and the first wire segment is orthogonal to the second wire segment. The back end of line metallization interconnect structure further includes a third wire segment in the first metallization layer, and a fourth wire segment in the second metallization layer, wherein the end of the fourth wire segment is above the end of the third wire segment, and the third wire segment is orthogonal to the fourth wire segment, and wherein the fourth wire segment is co-linear with the second wire segment. The back end of line metallization interconnect structure further includes a fifth wire segment in the first metallization layer, and a sixth wire segment in the second metallization layer, wherein the end of the sixth wire segment is above the end of the fifth wire segment, and the fifth wire segment is orthogonal to the sixth wire segment, and the fifth wire segment is orthogonal to the first wire segment and the third wire segment.

In accordance with yet another embodiment of the present invention, a method of forming a merged via is provided. The method includes forming a plurality of metal lines in a first metallization layer on a substrate, wherein each adjacent pair of metal lines is separated by a dielectric line. The method further includes forming a cap layer on each dielectric line, and forming a dielectric layer on the plurality of metal lines in a first metallization layer and cap layers. The method further includes forming a hard mask layer on the dielectric layer, and forming a plurality of trench templates on the hard mask layer. The method further includes forming a via mask layer on the plurality of trench templates, and forming a merged via opening in the via mask layer, wherein the via mask opening includes a compound shape having a first rectangular opening portion and a second rectangular opening portion that intersect at an angle.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to forming merged vias that relax or eliminate the requirements of the enclosure rule and Mask Rule Check (MRC) errors. The spacing of the metal lines and vias can thereby be reduced to increase device density while maintaining a high overall yield and reliability for the circuit design. Time dependent dielectric breakdown (TDDB) can affect the separation distance between conductors in back-end-of-line (BEOL) and middle of line (MOL) processes due to the fabrication tolerance and errors, so relaxation of some design rules without compromising the TDDB can increase device density without decreasing reliability.

Embodiments of the present invention relate generally to forming orthogonal merged vias having T-shapes and +-shapes (i.e., cross-shaped) that have a minimum space restriction by forming the merged via mask opening parallel and/or perpendicular to the metal lines in the upper metallization layer. These T-shaped and +-shaped merged vias can reduce the value (e.g., tolerance) of an enclosure rule and via-to-via distance, since the MRC errors are eliminated after merging. The shape of T-shaped and +-shaped merged vias allows the mask for the merged feature to shift along a direction parallel with a long axis of an opening in the mask without altering the self-aligned position of the via, whereas the merged feature may shift laterally along an axis orthogonal to the long axis of the mask.

Embodiments of the present invention relate generally to forming non-orthogonal merged vias having a V-shape (also referred to as a Y-shape) and Z-shape. The shapes can have 45 degree transitions.

Embodiments of the present invention relate generally to placing vias as close to the end of a metal line as possible without increasing time dependent dielectric breakdown (TDDB) or increasing electro-migration (EM) due to a via contact area becoming too small, for example, less than 40 percent (40%) of a nominal size. Placing vias as close to the end of an underlying and/or overlying metal line as possible can reduce wasted space used to meet design rules including the enclosure rule by reducing or eliminating the additional offset between the end of the metal line and the perpendicular edge of a via mask. Utilizing merged vias can also allow formation of multiple vias using a single mask opening.

Exemplary applications/uses to which the present invention can be applied include, but are not limited to: integrated circuits, including, but not limited to, microprocessors, application specific integrated circuits (ASICs), and memory chips.

Figure 1:
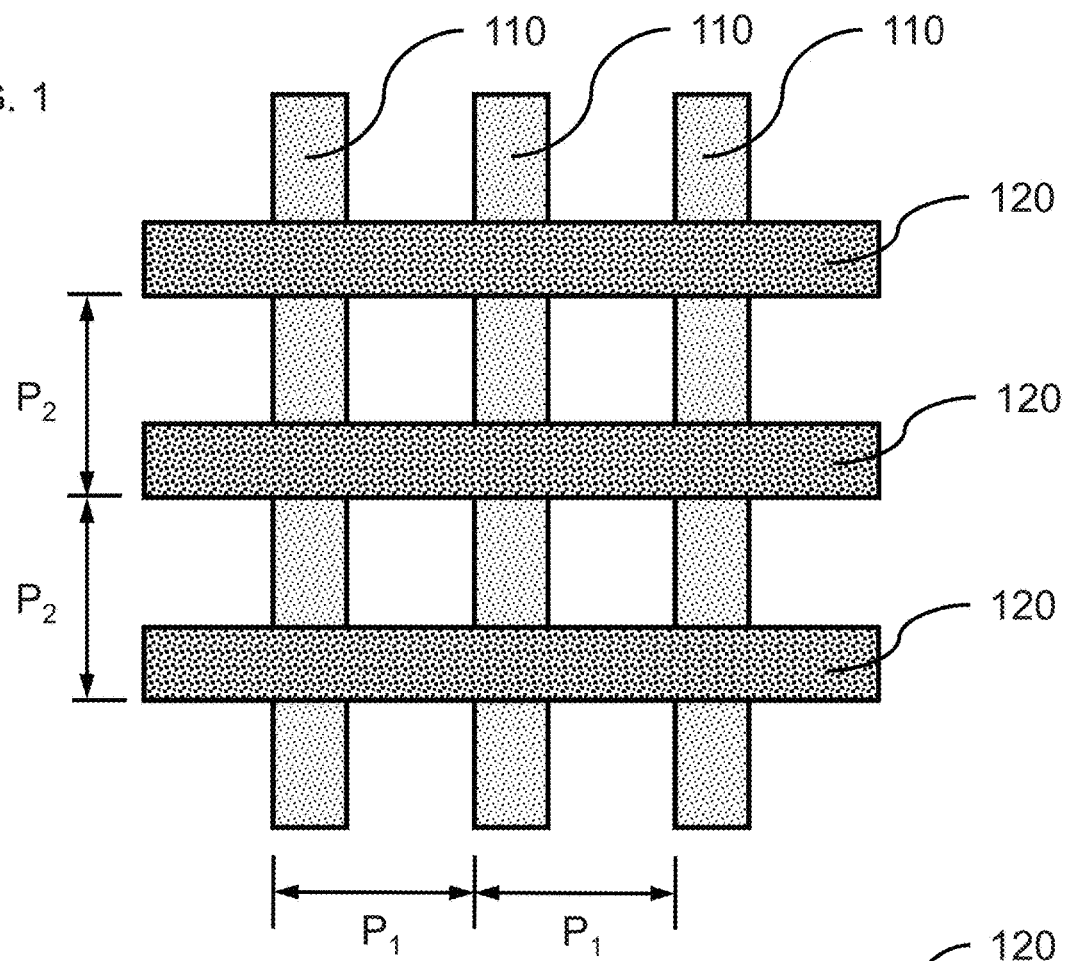
FIG. 1 is a top view showing a second array of metal lines over a first array of metal lines, in accordance with an embodiment of the present invention.

Referring now to the drawings in which like numerals represent the same or similar elements and initially to FIG. 1, a second array of metal lines over a first array of metal lines is shown, in accordance with an embodiment of the present invention.

In one or more embodiments, metal lines 110, 120 can be formed in different layers of multiple stacked metallization layers. The metal lines in one metallization layer can be aligned perpendicular to the direction of metal lines in metallization layers above and/or below the metal lines in the referenced metallization layer. Each metallization layer can consist of a grid of metal lines sandwiched between one or more dielectric layers for electrical isolation, where the metal lines in the same metallization layer can be parallel.

Metal lines 110, 120 on each of the metallization layers can be spaced at a constant pitch, where the metal lines 110 of a first metallization layer, M1, can have a first pitch, $P_1$, and the metal lines 120 of a second metallization layer, M2, can have a second pitch, $P_2$, where $P_1$ can be the same distance as $P_2$, or a different distance. In various embodiments, the distance of pitch, $P_1$, can be in a range of about 30 nanometers (nm) to about 100 nm, or in a range of about 30 nm to about 70 nm, or in a range of about 30 nm to about 50 nm, or in a range of about 40 nm to about 60 nm, although other distances are also contemplated. In various embodiments, the distance of pitch, $P_2$, can be in a range of about 30 nanometers (nm) to about 100 nm, or in a range of about 30 nm to about 70 nm, or in a range of about 30 nm to about 50 nm, or in a range of about 40 nm to about 60 nm, although other distances are also contemplated. The metal lines 110, 120 can be equally spaced in each metallization layer. The minimum pitches, $P_1$, $P_2$ can be determined by a resolution constraint.

In one or more embodiments, the metal lines 110, 120 formed in the metallization layers can have a width in a range of about 15 nm to about 40 nm, or about 20 nm to about 30 nm, although other widths are also contemplated. The minimum width of the metal lines 110, 120 can be determined by the design rules and resolution limit of the lithography and fabrication processes.

In various embodiments, the metal lines 110, 120 and vias between metal lines can be made of a conductive material, which can be a metal, for example, tungsten (W), copper (Cu), cobalt (Co), tantalum (Ta), titanium (Ti), manganese (Mn); a conductive metal compound, for example, tantalum nitride (TaN), titanium nitride (TiN), titanium carbide (TiC), a copper manganese alloy (Cu—Mn), or any suitable combination thereof.

Figure 2:
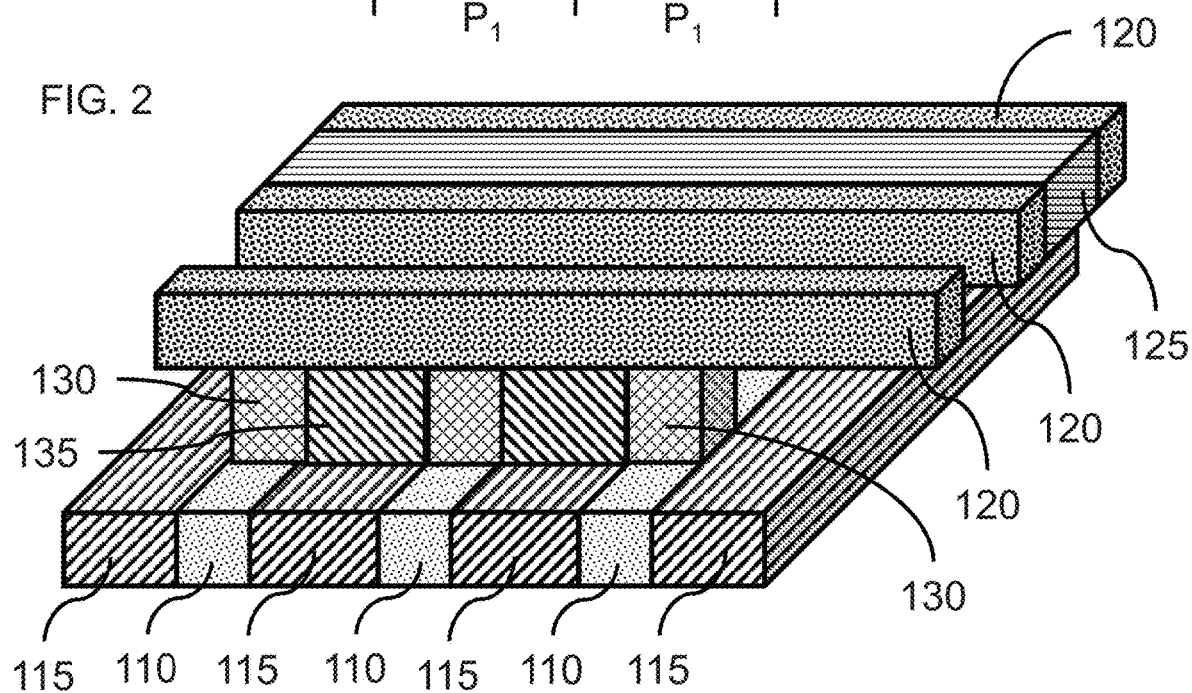
FIG. 2 is a three-dimensional cut-away view showing the array of metal lines in a second metallization layer separated by dielectric lines, and connected to an array of metal lines in a first metallization layer by vias, in accordance with an embodiment of the present invention.

FIG. 2 is a three-dimensional cut-away view showing the array of metal lines in a second metallization layer separated by dielectric lines, and connected to an array of metal lines in a first metallization layer by vias, in accordance with an embodiment of the present invention.

In one or more embodiments, each metallization layer can consist of a grid of metal lines sandwiched between one or more dielectric layers for electrical isolation. A first metallization level, M1, can include a plurality of parallel metal lines 110 separated by insulating dielectric lines 115. A second metallization level, M2, can include a plurality of parallel metal lines 120 separated by insulating dielectric lines 125. Vias 130 can connect the metal lines 110 of the first metallization layer to the metal lines 120 of the second metallization layer. Dielectric plugs 135 can electrically isolate vias 130 from each other and other adjacent metal lines, where the dielectric plugs 135 and insulating dielectric lines 125 can be part of an intervening dielectric layer, V0, between metallization layers M1 and M2. The trench(es) for the metal lines of a particular metallization layer may extend only partially into the thickness of a dielectric layer (i.e., an interlevel or interlayer dielectric (ILD) layer) from the top surface of the ILD layer. Additional dielectric layers and metallization layers can be formed above metallization layers M1 and M2. Additional layers, such as cap layers and hard mask layers, can be between the dielectric layers and metallization layers.

In one or more embodiments, the height (i.e., thickness) of each of the metallization layers can be in a range of about 20 nm to about 50 nm, or in a range of about 20 nm to about 30 nm. The metal lines 110, 120 can have the same height as the height of the metallization layer, where the metal lines are formed in trenches etched into a dielectric material forming the metallization layer. The metal lines can have a square cross-section, where the height and width can be about the same. The dielectric layers, V0, V1, etc., can be thicker than the metallization layers, where the trenches for the metal lines may only extend partially into the dielectric layers.

Figures 3, 4:
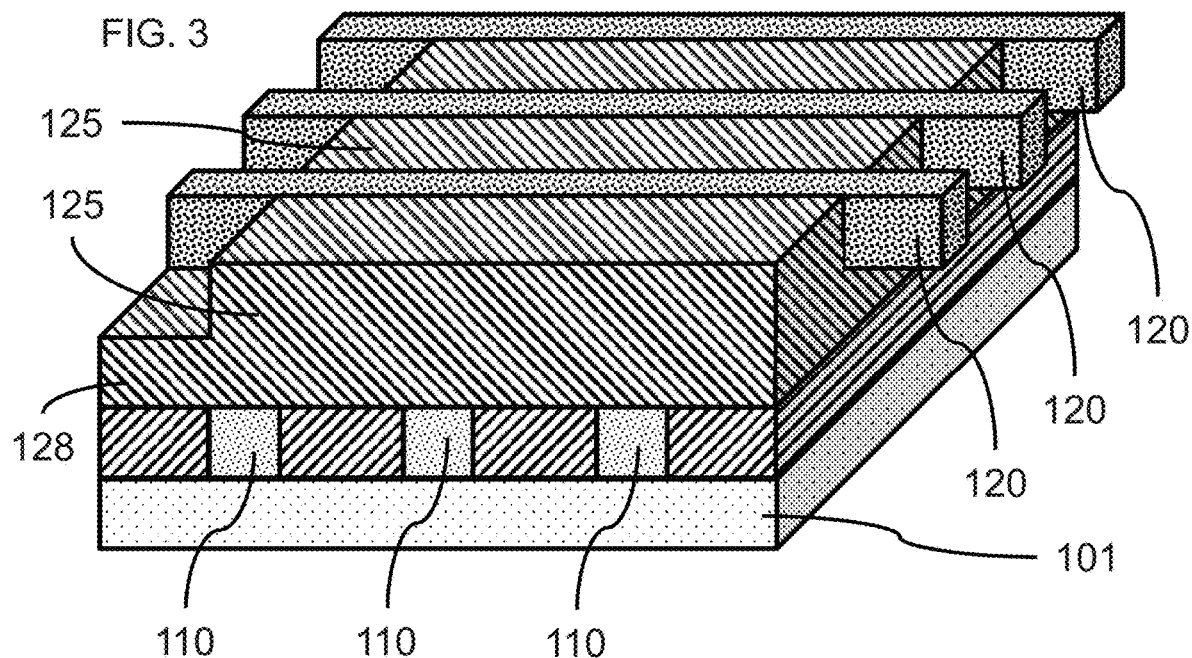
FIG. 3 is a three-dimensional cut-away view showing the array of parallel metal lines in a second metallization layer and an array of parallel metal lines in a first metallization layer on a substrate separated by a dielectric layer, in accordance with an embodiment of the present invention.
FIG. 4 is a top view showing a second array of metal lines and cut wire segments over a first array of cut wire segments, and an outline of a printed merged via mask pattern with corner rounding, in accordance with an embodiment of the present invention.

FIG. 3 is a three-dimensional cut-away view showing the array of parallel metal lines in a second metallization layer and an array of parallel metal lines in a first metallization layer on a substrate separated by a dielectric layer, in accordance with an embodiment of the present invention.

In one or more embodiments, the metal lines 120 of the second metallization layer can be separated from the metal lines of the first metallization layer by dielectric layer 128, where an upper portion of the dielectric layer 128 can form dielectric lines 125 between the metal lines 120.

The metallization layers, M1, M2, and dielectric layers, V0, etc, can be formed on a substrate 101 that can include previously fabricated semiconductor devices, including, but not limited to, transistors, capacitors, inductors, resistors, and diodes. The metallization layers, M1, M2, and dielectric layers, V0, etc, can form a back end of line metallization interconnect structure for electrically connecting the semiconductor devices to each other and external electrical connections.

In one or more embodiments, a substrate 101 can be, for example, a single crystal semiconductor material wafer or a semiconductor-on-insulator stacked wafer. The substrate can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)), or an implanted layer can form a buried insulating material.

The active semiconductor layer can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)).

FIG. 4 is a top view showing a second array of metal lines and cut wire segments over a first array of cut wire segments, and an outline of a printed merged via mask patter with corner rounding, in accordance with an embodiment of the present invention.

Each metal line 110, 120 can be split into wire segments 112, 122 by line end-cuts, or the line end can be formed by direct printing. Two co-linear wire segments 122 can be separated from adjacent metal lines 120 and wire segments 122 on the same metallization layer by a distance determined by a design rule. Use of multiple lithography masks and multiple patterning (e.g., double patterning) steps can place line end cuts closer together, but each additional lithography mask can incur additional costs and processing steps, that reduce the overall process efficiency. Additional space may be required by the design rules to account for each of the separate features to be formed in close proximity, and the summation of tolerances for each registration error.

In various embodiments, the vias 130 can be formed between the metal lines 110 or wire segments 112 in a first metallization layer and metal lines 120 or wire segments 122 in a second metallization layer. The vias 130 can be patterned using a via mask that is aligned with overlapping portions of the metal lines 120 and wire segments 122 and/or metal lines 110 or wire segments 112.

While separate openings in the via mask can be used to locate and pattern each via 130 separately, a merged via mask can be formed by combining the openings for two or more adjacent vias 130. By combining the via openings in the mask, the need to form and optically resolve the two separate openings can be eliminated. In addition, the limitation on the pitch or distance between the metal lines and/or wire segments due to the design rules can be reduced or eliminated, since the two or more adjacent features no longer need to be resolved individually by lithography. In various embodiments, the spacing of the metal lines and wire segments can be reduced to the line spacing resolution limit because additional spacing to resolve two separate via openings and/or space for the enclosure rule can be eliminated.

In one or more embodiments, two or more via openings can be combined into a single merged via opening 210 in a via mask, where the merged via opening can have a compound shape including a first rectangular opening portion and a second rectangular opening portion that intersect at an angle. The compound shape can be, for example, an orthogonal shape (e.g., T-shape or +-shape), or a non-orthogonal shape (e.g., a V-shape or Z-shape). The T-shape, +-shape, V-shape, or Z-shape can be formed as a single feature in a lithography mask, so the merged via opening 210 can be formed in a resist material in a single lithography step rather than forming each rectangular opening portion in a separate lithography step. Formation of the lithography mask pattern and merged via openings, therefore, do not result in an odd cycle for double or multiple patterning methods. The merged via opening 210 can overlap two or more predetermined design locations for vias 130.

The merging of the features and patterning of orthogonal openings can result in corner rounding of the inside and outside corners of the merged via opening 210. While the lithography mask pattern can be formed with sharp corners, printing the merged via opening 210 in the resist material can result in rounded corners 215 at the intersection and ends of the opening portions. The intersection of the legs of the merged via opening 210 can have rounded inside corners. The legs of the merged via opening 210 can be wider than the metal lines 110, 120 and vias 130, and extend beyond the ends of the metal lines 110, 120 and vias 130 to meet the performance requirements, such as TDDB and/or EM, due to masking and printing variances.

Shifting of the merged via opening 210 along an axis joining two vias located on co-linear metal lines or wire segments may have no effect on the position of the resulting via due to self-alignment of the via with the trench edges for the metal lines 120. Shifting of the merged via opening laterally can be compensated for by increasing the width of the opening to be greater than the trench or via size by an amount equal or greater than the positioning variance of the lithography mask. One or more vias can be below the merged via opening at the end of the first metal lines in a first metallization layer and/or second metal lines in a second metallization layer without additional enclosure.

In various embodiments, the end of a first metal line 110 or wire segment 112 in a first metallization layer may extend beyond the edge of the second metal line 120 or wire segment 122 in a second metallization layer by a distance in a range of about 1.5 nm to about 6 nm, or about 4 nm to about 5 nm. In various embodiments, the end of a first metal line 110 or wire segment 112 in a first metallization layer may not extend beyond the edge of the second metal line 120 or wire segment 122 in a second metallization layer by more than 1.5 nm.

In various embodiments, the corner rounding experienced in printing the merged via opening in a resist material does not influence the via shapes formed because the rounded corners land on areas of the metallization layers and dielectric layers that are between the metal lines and trenches, so do not transfer to the underlying layers. Trench template layers and/or hard mask layers can align the via positions and block etching of intermediate spaces and metal lines.

Figure 5:
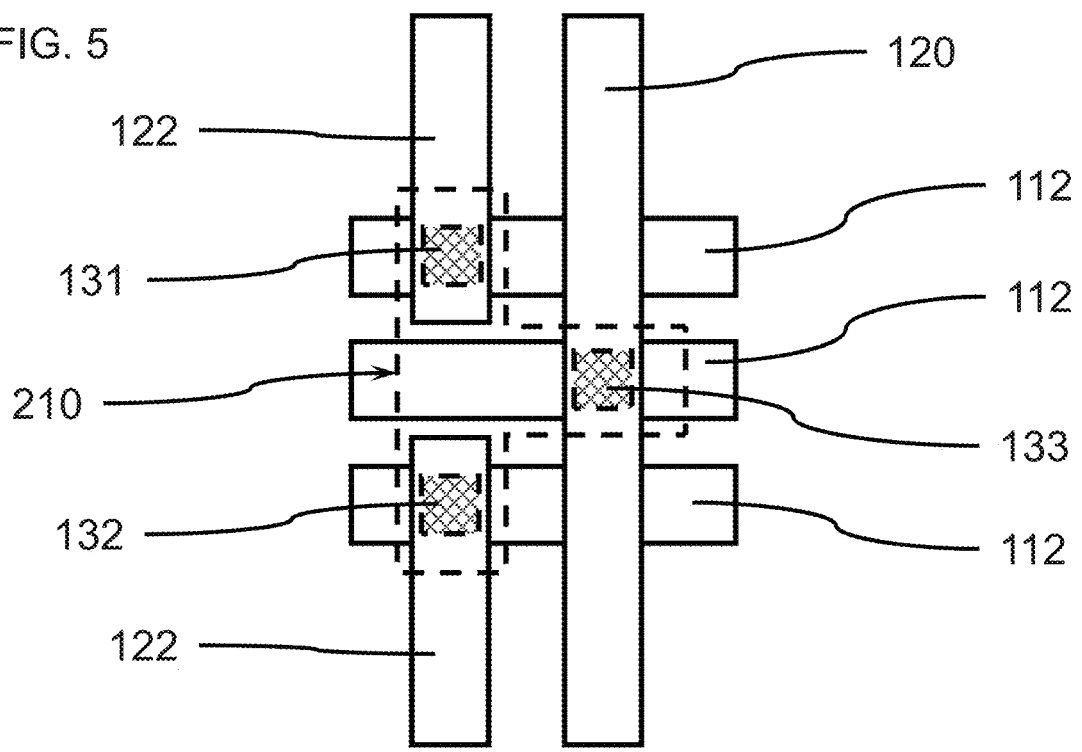
FIG. 5 is a top view showing an orthogonal T-shaped merged via opening over an array of cut and uncut metal lines, in accordance with an embodiment of the present invention.

FIG. 5 is a top view showing an orthogonal T-shaped merged via opening over an array of cut and uncut metal lines, in accordance with an embodiment of the present invention.

In one or more embodiments, a merged via opening 210 can have a compound shape formed by a first rectangular opening portion and a second rectangular opening portion that intersects the first rectangular opening portion, where each opening portion extending from the intersection can be a leg of the merged via opening 210. The first rectangular opening and second rectangular opening portion can form a merged via opening 210 having a T-shape, where the opening overlays three intersecting positions of the metal lines 110, 120 and/or wire segments 112, 122 on the first and second metallization layers to form vias 131, 132, 133. Two of the wire segments 122 on the second metallization layer can be co-linear, where the end-cuts of each wire segment 122 can be tip-to-tip separated by a predetermined distance, and the vias 131, 132 can be formed at the intersection of the wire segments 112 and wire segments 122. The third via position 133 can be orthogonal to the axis of co-linear wire segments 122 and via positions 131, 132. The ends of wire segments 112 in the first metallization layer can extend past the edges of metal lines 120 and wire segments 122 in the second metallization layer by a minimal amount due to the self-aligned nature of the trench edges forming the metal lines 120 and wire segments 122. The first rectangular opening portion can intersect the second rectangular opening portion at an angle. In various embodiments, the angle can be between about 20° to about 160°, or about 45° to about 135°, or about 90°, although other angles are contemplated. An angle of 90° can form an orthogonal T-shaped or +-shaped merged via opening depending on where the rectangular opening portions intersect.

Figure 6:
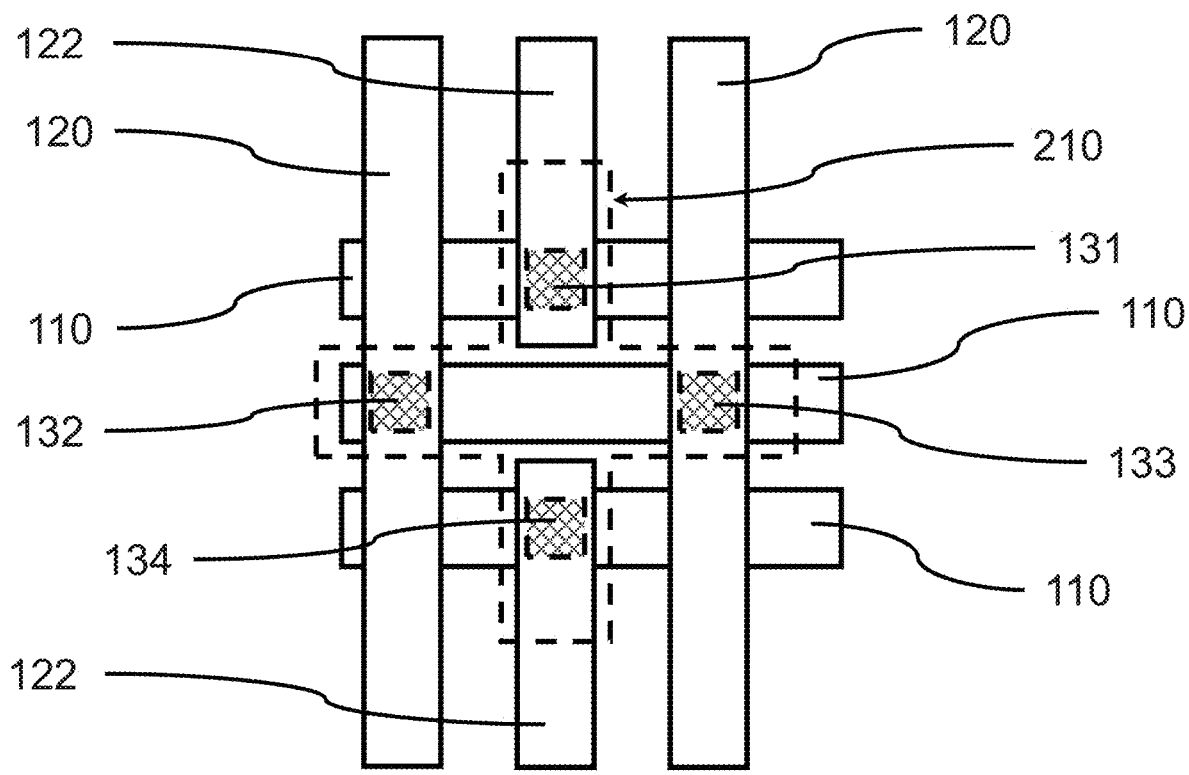
FIG. 6 a top view showing an orthogonal +-shaped (cross-shaped) merged via opening over an array of cut and uncut metal lines, in accordance with an embodiment of the present invention.

FIG. 6 is a top view showing an orthogonal +-shaped (cross-shaped) merged via opening over an array of cut and uncut metal lines, in accordance with an embodiment of the present invention.

In one or more embodiments, a merged via opening 210 can include a first rectangular opening portion and a second rectangular opening portion that intersects the first rectangular opening portion. The first rectangular opening portion can bisect the second rectangular opening portion at an angle. The first rectangular opening portion and second rectangular opening portion can form a merged via opening 210 having a +-shape (cross shape), where the opening overlays four intersecting positions of the metal lines or wire segments on the first and second metallization layers to form vias 131, 132, 133, 134. A first two of the wire segments 122 on the second metallization layer can be co-linear, where the end-cuts of each wire segment 122 can be tip-to-tip separated by a predetermined distance, and the vias 131, 134 can be formed at the intersection of the wire segments 122 and metal lines 110. The third and fourth via positions 132, 133 can be co-linear and orthogonal to the axis of co-linear wire segments and via positions 131, 134. The ends of wire segments 122 can extend past the edges of metal lines 110 by a minimal amount due to the self-aligned nature of the trench edges forming the metal lines 110, 120.

In addition, the tip-to-tip distance between the co-linear wire segments 122 can be reduced due to the reduced value of the enclosure rule. The leg of the merged via can be bar-shaped and can be parallel with the tip-to-tip wire segments 122. The Line End Tip-to-Tip distance can be reduced by moving the vias to the ends of the wire segments for the bar-shaped merged via.

Figure 7:
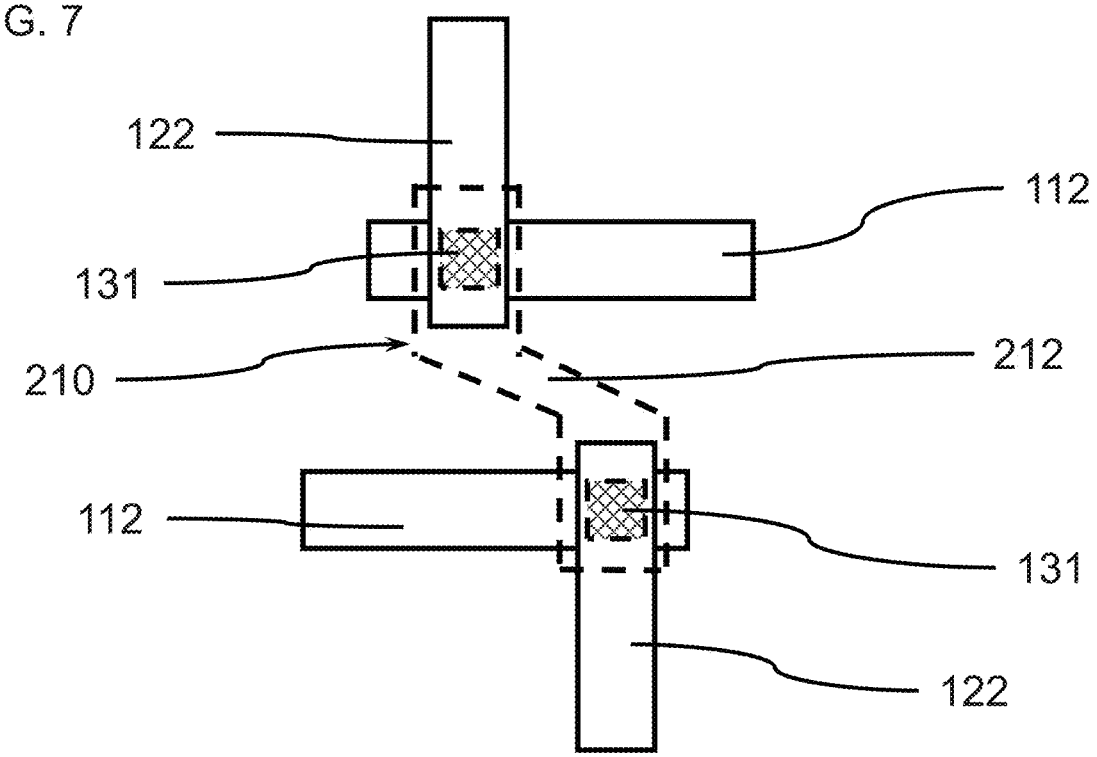
FIG. 7 is a top view showing a non-orthogonal Z-shaped merged via opening over an array of cut metal lines, in accordance with an embodiment of the present invention.

FIG. 7 is a top view showing a non-orthogonal Z-shaped merged via opening over an array of cut metal lines, in accordance with an embodiment of the present invention.

In one or more embodiments, the merged via opening 210 can have three or more rectangular opening portions that are joined to form a non-orthogonal or zig-zag shape that can form vias at the ends of two wire segments 112, 122 that are not positioned tip-to-tip (i.e., co-linear). Due to the self-aligned aspect, the vias can be formed at the ends of the wire segments. The connecting leg 212 of the merged via opening 210 can have a non-90 degree angle with the wire segments and rectangular openings at opposite ends of the merged via opening 210. The merged via opening shapes can have 45 degree transitions, where two of the rectangular openings are parallel and the transition rectangular opening intersects the end rectangular openings at an angle. An angle ≠90° can form a non-orthogonal merged via opening.

Figure 8:
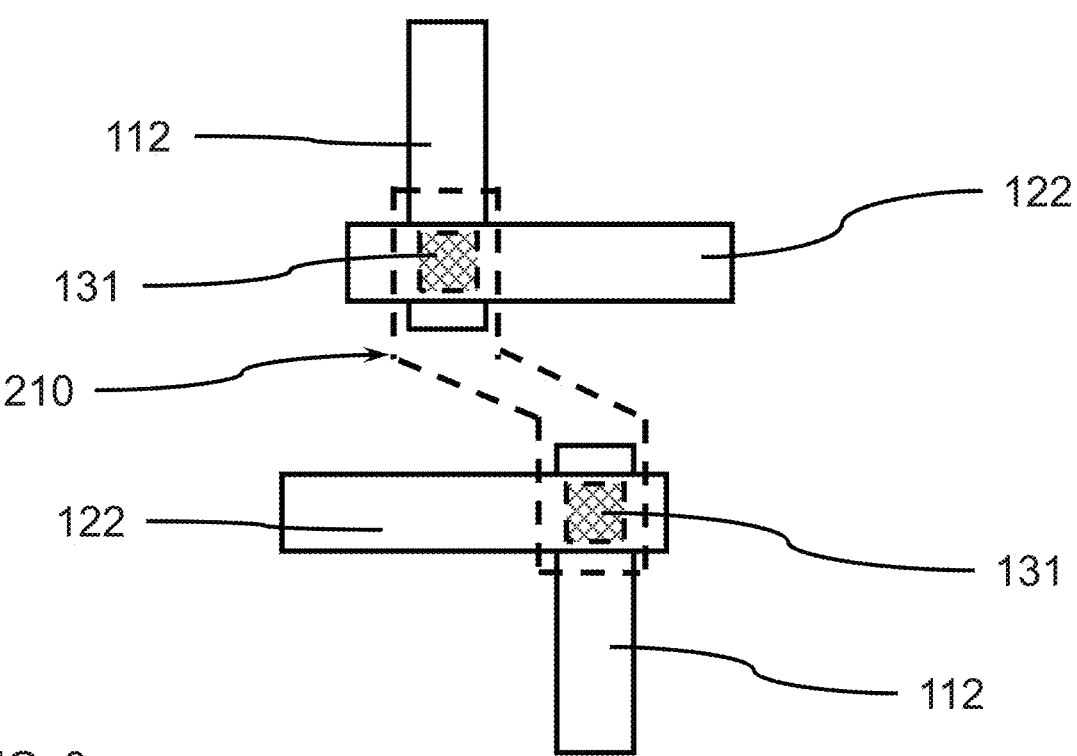
FIG. 8 is a top view showing a non-orthogonal Z-shaped merged via opening over an array of cut metal lines with a reversed orientation, in accordance with an embodiment of the present invention.

FIG. 8 is a top view showing a non-orthogonal Z-shaped merged via opening over an array of cut metal lines with a reversed orientation, in accordance with an embodiment of the present invention.

In various embodiments, the direction of the metal lines 110 and/or wire segments 112 in the M1 metallization layer can be rotated 90 degrees to be vertically oriented, and the metal lines 120 and/or wire segments 122 in the M2 metallization layer can be rotated 90 degrees to be horizontally oriented. Metal lines and wire segments above the M2 metallization layer can also be rotated 90 degrees to maintain the perpendicular/parallel sequence, so the vertical pattern is reversed.

Figure 9:
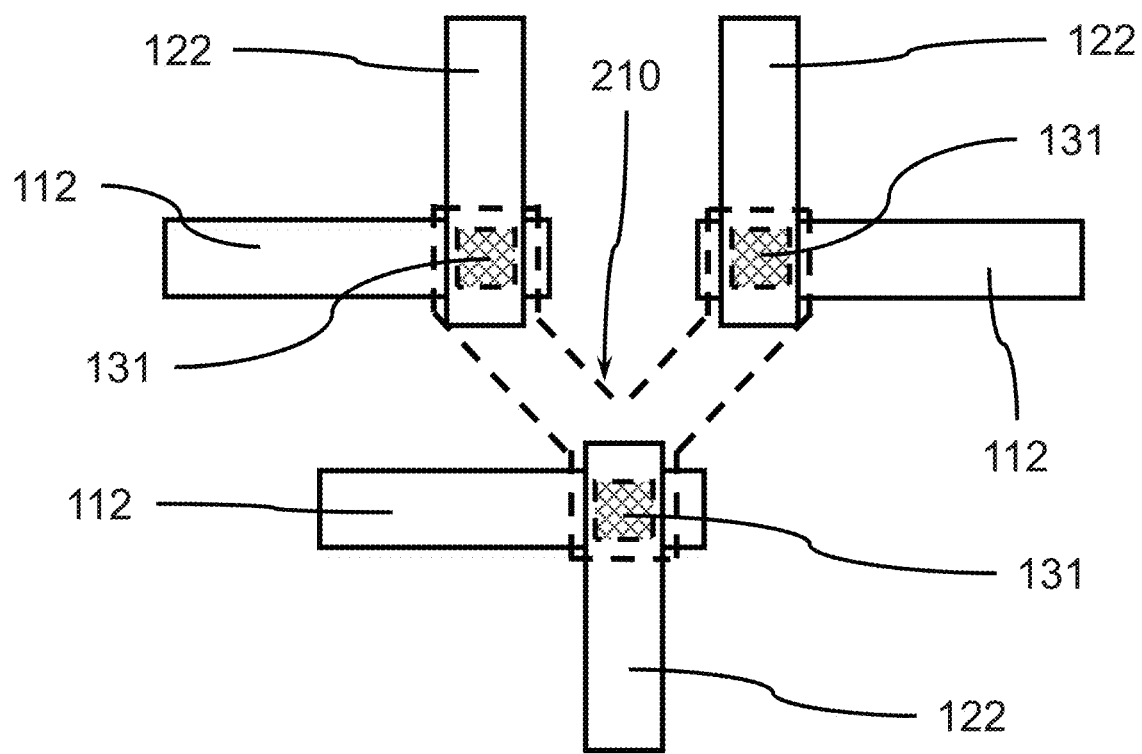
FIG. 9 is a top view showing a non-orthogonal V-shaped (also referred to as a Y-shape) merged via opening over an array of cut metal lines, in accordance with an embodiment of the present invention

FIG. 9 is a top view showing a non-orthogonal V-shaped (or Y-shaped) merged via opening over an array of cut metal lines, in accordance with an embodiment of the present invention.

In one or more embodiments, the merged via opening 210 can have two rectangular opening portions that are joined at an angle at the ends of the rectangular openings to form a non-orthogonal merged via opening 210. The merged via opening 210 can have a non-orthogonal or V shape that can form vias at the ends of two wire segments 112, 122 that may or may not be positioned tip-to-tip, and a third intersection of wire segments that may not be tip-to-tip or in the same line with the other wire segments. The V-shaped (Y-shaped) merged via opening 210 can be a combination of two non-orthogonal Z-shaped merged via openings that can overlap non-orthogonal via locations. The two non-orthogonal Z-shaped merged via openings can be the same or different sizes and have the same or different transition angles. The merged via opening 210 can allow formation of an odd number of non-orthogonal via locations without violating 'odd cycle' rules for double patterning layouts. Other merged via openings can be formed by combining more than two non-orthogonal Z-shaped merged via openings.

Figure 10:
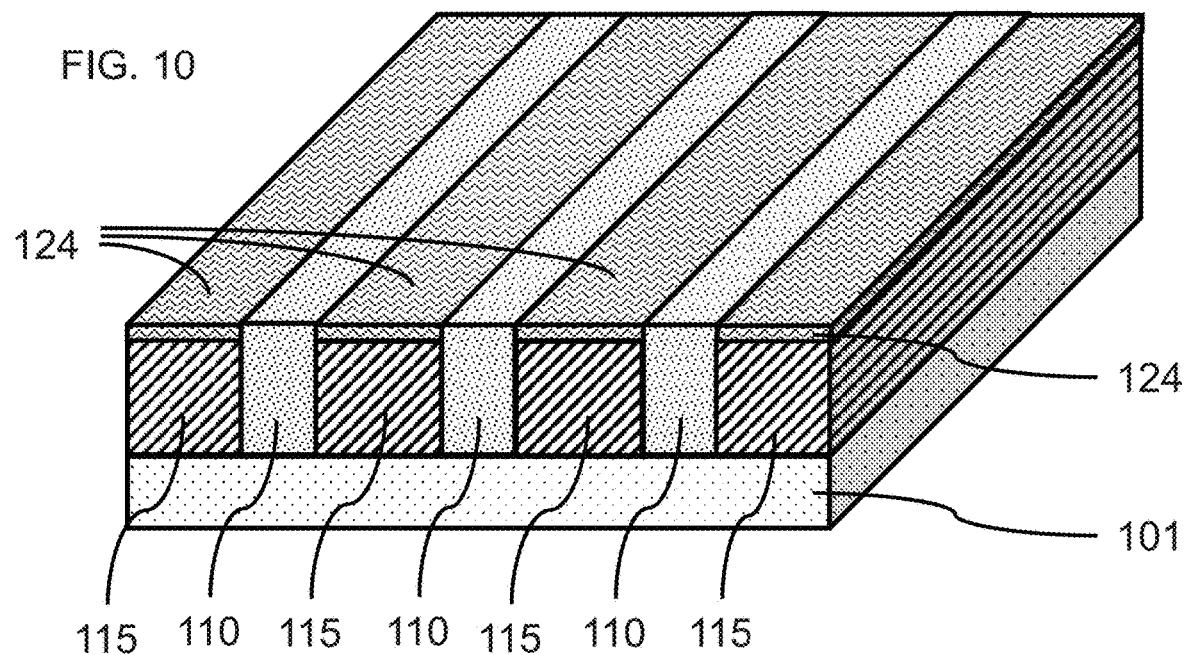
FIG. 10 is an isometric view showing metal lines of a first metallization layer on a substrate, and a cap layer on the dielectric lines, in accordance with an embodiment of the present invention.

FIG. 10 is an isometric view showing metal lines of a first metallization layer on a substrate, and a cap layer on the dielectric lines, in accordance with an embodiment of the present invention.

In one or more embodiments, a lower dielectric layer can be formed on a substrate 101, where the substrate can include fabricated device components. One or more trenches can be formed in the lower dielectric layer to form dielectric lines 115, and the trenches filed with a first conductive material to form metal lines 110 separated by dielectric lines 115. The metal lines 110 can be electrically connected to electrical contacts to the semiconductor device components in the substrate.

In various embodiments, the lower dielectric layer and dielectric lines 115 can be made of silicon oxide (SiO) (e.g., $SiO_2$), a low-K material, or a combination thereof. A low-K dielectric can include amorphous carbon (a-C), fluorine doped silicon oxide (SiO:F), carbon doped silicon oxide (SiO:C), SiCOH, silicon boro carbonitride (SiBCN), or a combination thereof.

In various embodiments, a cap layer 124 can be formed on the dielectric lines 115, where the cap layer 124 can be a dielectric material, including, but not limited to, silicon nitride (SiN), silicon oxynitride (SiON), silicon carbonitride (SiCN), silicon boronitride (SiBN), silicon borocarbide (SiBC), low-K dielectric, or combinations thereof. The cap layer 124 can be a material different from the dielectric lines 115 and metal lines 110, such that the metal lines 110 can be selectively etched, for example by a wet chemical etch or reactive ion etch (RIE). The cap layer 124 can be an etch stop that protects the dielectric lines 115.

Figure 11:
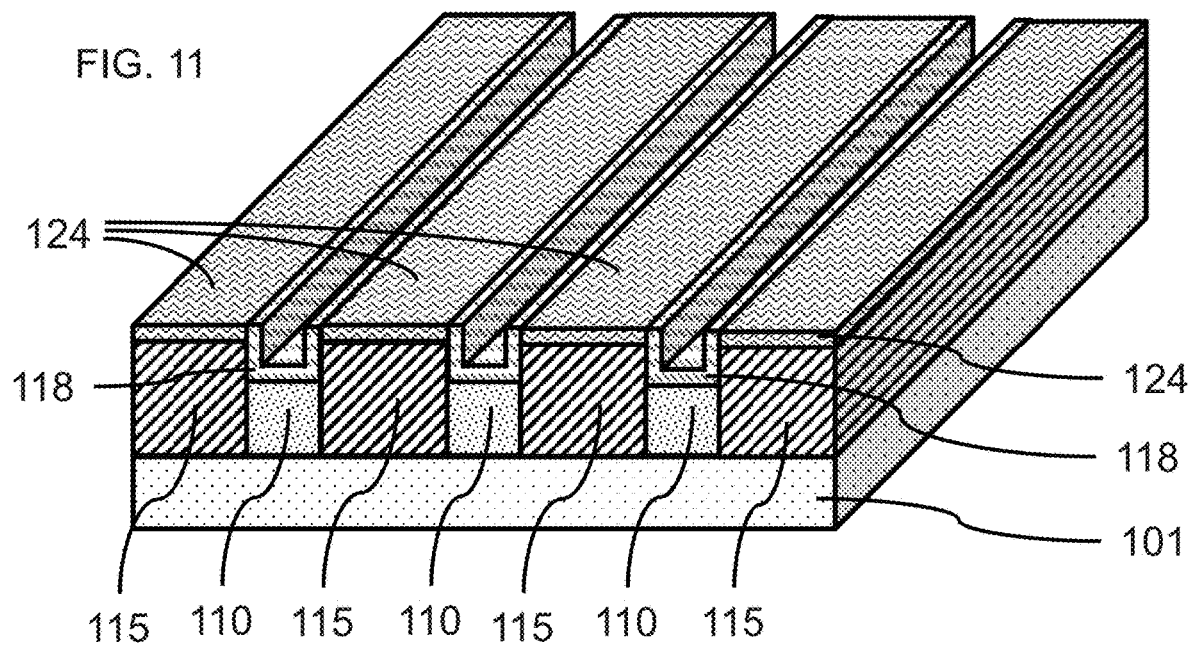
FIG. 11 is an isometric view showing sacrificial plugs in recessed channels above each of the recessed metal lines, in accordance with an embodiment of the present invention.

FIG. 11 is an isometric view showing sacrificial plugs in recessed channels above each of the recessed metal lines, in accordance with an embodiment of the present invention.

In one or more embodiments, the metal lines 110 can be recessed using a selective etch (e.g., RIE) and a plug layer formed on the cap layer 124 and recessed metal lines 110. A chemical-mechanical polishing (CMP) can be used to remove the portion of the sacrificial plug layer on the cap layer 124, while leaving sacrificial plugs 118 in each of the recesses over the metal lines 110.

In various embodiments, a sacrificial plug 118 can be formed on each of the metal lines 110, where the sacrificial plugs 118 can be a dielectric material, including, but not limited to, silicon nitride (SiN), silicon oxynitride (SiON), silicon carbonitride (SiCN), silicon boronitride (SiBN), silicon borocarbide (SiBC), low-K dielectric, or combinations thereof. The sacrificial plugs 118 can be a material different from the cap layer 124 and metal lines 110, such that the sacrificial plugs 118 can be selectively etched.

Figure 12:
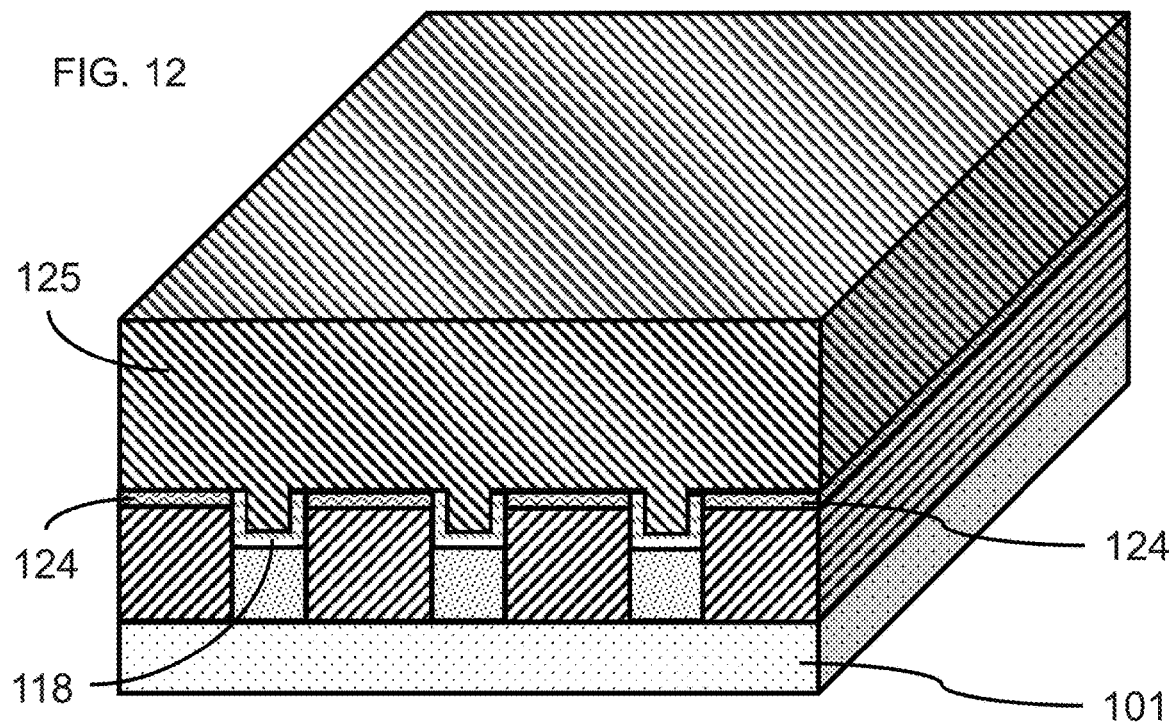
FIG. 12 is an isometric view showing a first dielectric layer on a cap layer, the sacrificial plugs, and first metallization layer, in accordance with an embodiment of the present invention.

FIG. 12 is an isometric view showing a first dielectric layer on a cap layer, the sacrificial plugs, and first metallization layer, in accordance with an embodiment of the present invention.

In one or more embodiments, a first dielectric layer 125 can be formed on the cap layer 124 and sacrificial plugs 118. The first dielectric layer 125 can be blanket deposited and fill in sacrificial plugs 118. In various embodiments, the first dielectric layer 125 can be made of silicon oxide (SiO) (e.g., $SiO_2$), a low-K material, or a combination thereof. A low-K dielectric can include amorphous carbon (a-C), fluorine doped silicon oxide (SiO:F), carbon doped silicon oxide (SiO:C), SiCOH, silicon boro carbonitride (SiBCN), or a combination thereof. The first dielectric layer 125 can be the same material as the lower dielectric layer and dielectric lines 115, or the first dielectric layer 125 can be a different material from the lower dielectric layer and dielectric lines 115.

Figure 13:
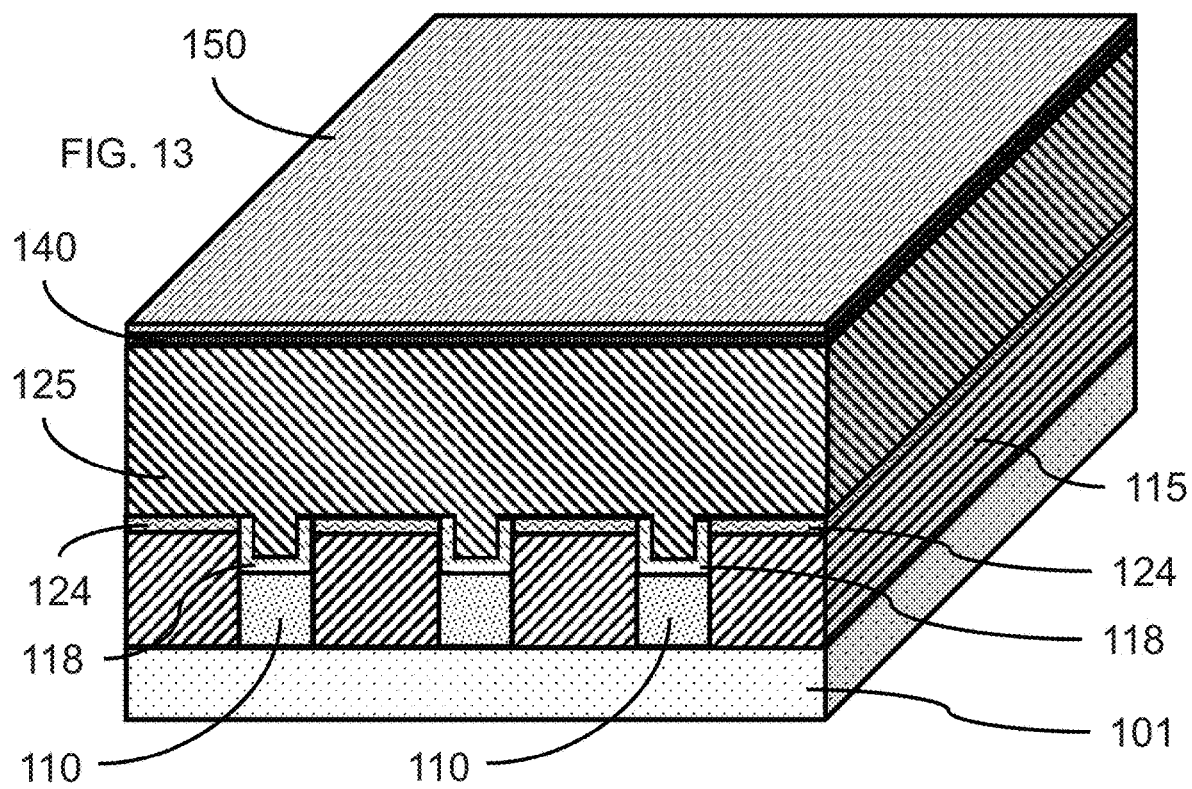
FIG. 13 is an isometric view showing a hard mask layer on the first dielectric layer, and a trench template layer on the hard mask layer, in accordance with an embodiment of the present invention.

FIG. 13 is an isometric view showing a hard mask layer on the first dielectric layer, and a trench template layer on the hard mask layer, in accordance with an embodiment of the present invention.

In one or more embodiments, a hard mask layer 140 can be formed on the first dielectric layer 125, for example, by chemical vapor deposition (CVD). The hard mask layer 140 can be a dielectric material, including, but not limited to, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. The hard mask layer 140 can be selectively etchable relative to the first dielectric layer 125, sacrificial plugs 118, and metal lines 110.

In one or more embodiments, a trench template layer 150 can be formed on the hard mask layer 140 and/or first dielectric layer 125, for example, by chemical vapor deposition (CVD). The trench template layer 150 can be a dielectric material, including, but not limited to, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. The trench template layer 150 can be selectively etchable relative to the hard mask layer 140, first dielectric layer 125, sacrificial plugs 118, and metal lines 110.

Figure 14:
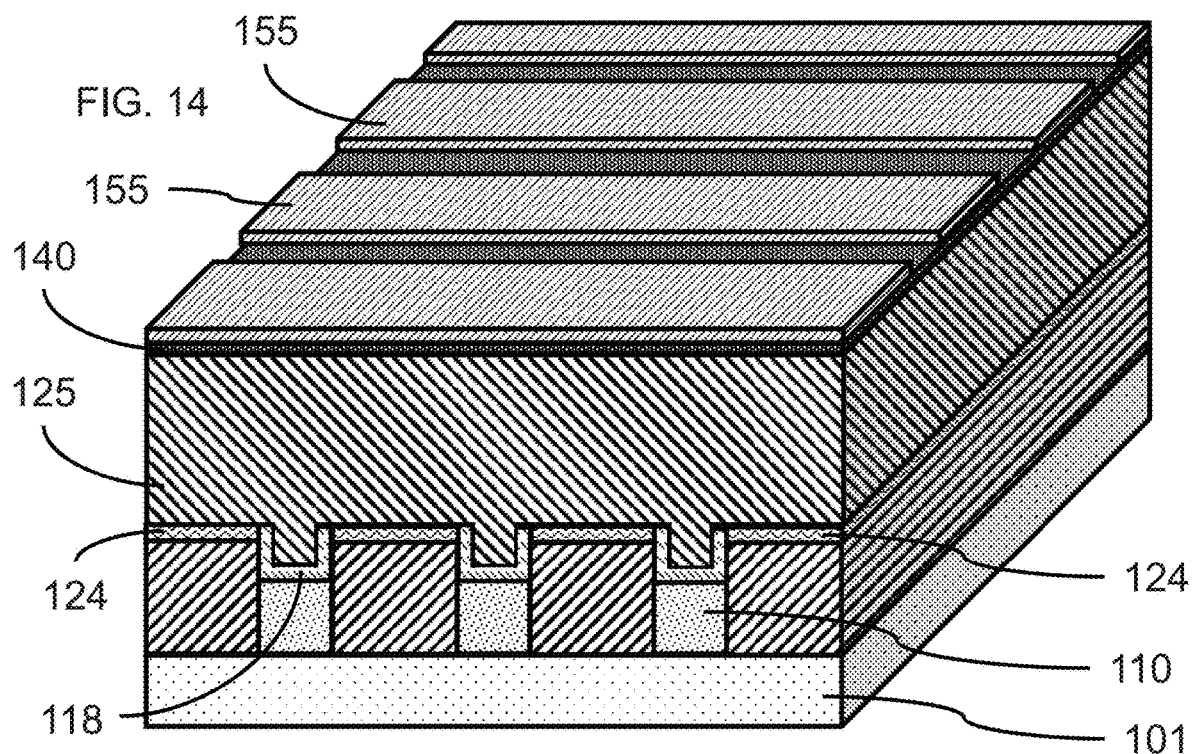
FIG. 14 is an isometric view showing a patterned trench template layer on the hard mask layer, in accordance with an embodiment of the present invention.

FIG. 14 is an isometric view showing a patterned trench template layer on the hard mask layer, in accordance with an embodiment of the present invention.

In one or more embodiments, the trench template layer 150 can be patterned and etched to form a plurality of trench templates 155, where a portion of the hard mask layer 140 can be exposed between the trench templates 155. The trench templates 155 and exposed portions of the hard mask layer 140 can be orthogonal to the metal lines 110. The spacing of the trench templates 155 can define the width of subsequently formed metal line in the second metallization layer.

Figure 15:
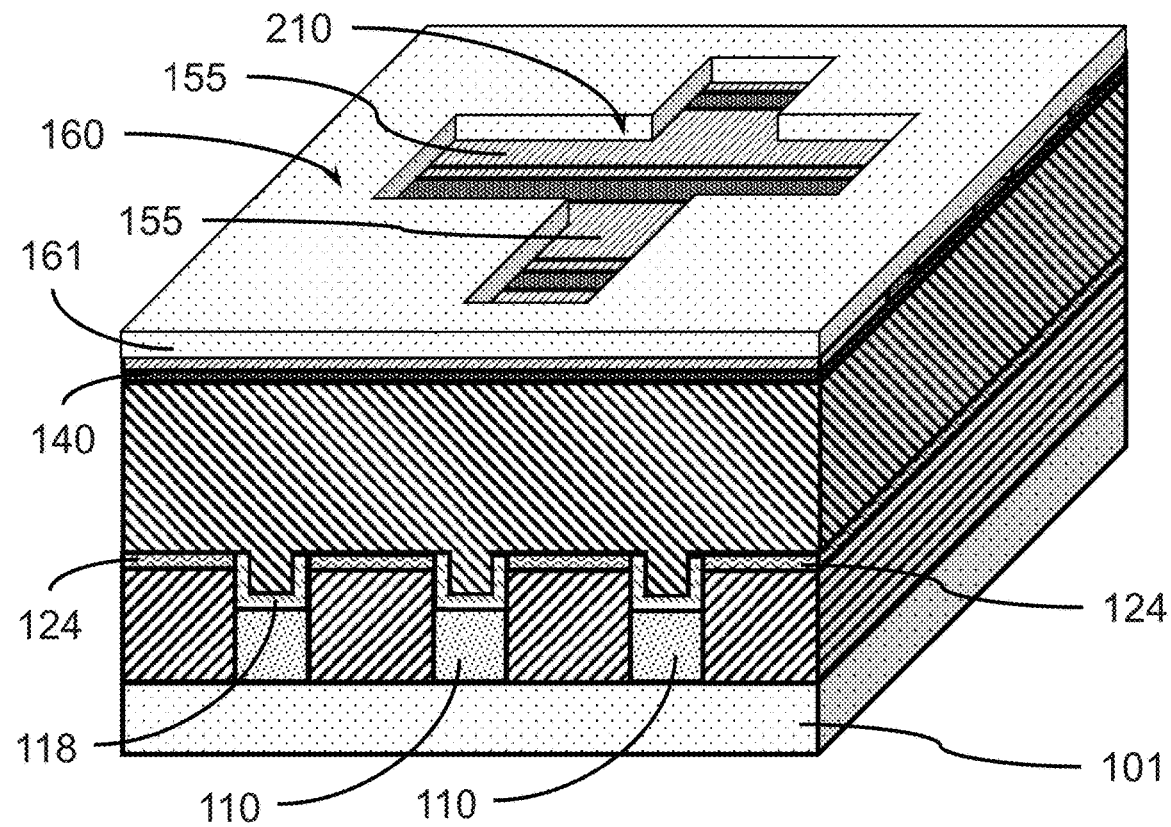
FIG. 15 is an isometric view showing a patterned via mask layer on the hard mask layer, in accordance with an embodiment of the present invention.

FIG. 15 is an isometric view showing a patterned via mask layer on the hard mask layer, in accordance with an embodiment of the present invention.

In one or more embodiments, a via mask layer 160 can be formed on the trench templates 155 and exposed portions of the hard mask layer 140. The via mask layer 160 can be a lithography resist material layer that can be patterned and developed using a photolithography mask and light source exposure. In various embodiments, a merged via opening 210 having a T-shape, +-shape, V-shape, or Z-shape can be formed in the via mask layer 160. While the merged via opening 210 is shown with sharp corners, this is for illustrative purposes only, as the opening can have rounded corners. The underlying trench templates 155 and exposed portions of the hard mask layer 140 can be exposed through the merged via opening 210, where the merged via opening 210, trench templates 155, and cap layer 124 can be utilized to form self-aligned or fully aligned vias.

In various embodiments, the exposed portion of the hard mask layer 140 and underlying portions of the first dielectric layer 125 can be removed using one or more selective etches. The trench templates 155 and merged via opening 210 can align the vias etched into the first dielectric layer 125 with the orthogonal cap layers 124 and sacrificial plugs 118. The formed vias can be bounded by the edges of the trench templates 155, orthogonal cap layers 124, and the sacrificial plugs 118.

A merged via can eliminate one degree of variability, since there is no need to resolve two shapes for separate vias printed on two different lithographic masks. Shifting a mask for a merged via along the long axis of the mask does not alter the position of the self-aligned via using the sidewalls of the trench to position the vias. A lateral shifting of the merged via mask can alter the placement of the self-aligned via relative to the underlying metal line, but the masking tolerances can be increased to compensate for such lateral misalignment without increasing the line-to-line spacing.

In one or more embodiments, a merged via mask layer 160 can include a lithographic resist layer 161 on a substrate 101, and a merged via opening 210 in the lithographic resist layer 161, wherein the merged via opening 210 has a first rectangular opening portion and a second rectangular opening portion that intersects the first rectangular opening portion at an angle, and wherein the merged via opening is above at least two predetermined via locations. The merged via mask layer 160 can be on a dielectric layer 125 of a back end of line metallization interconnect structure on the substrate 101, and wherein the merged via opening 210 has a T-shape, +-shape, V-shape, or Z-shape. The merged via opening 210 can be positioned above a first metal line 110 in a first metallization layer and over trench templates 155 on a second metallization layer of the back end of line metallization interconnect structure. The merged via opening 210 can have rounded inside corners, wherein the rounded inside corners are not located directly above the metal lines 110 in the first metallization layer or the openings between the trench templates 155 on the second metallization layer. One via can be formed at an end of the first metal line 110 in the first metallization layer and a second metal line 120 in the second metallization layer without additional enclosure, wherein the end of the first metal line in the first metallization layer does not extend beyond the edge of the second metal line in the second metallization layer by more than 1.5 nm.

Figure 16:
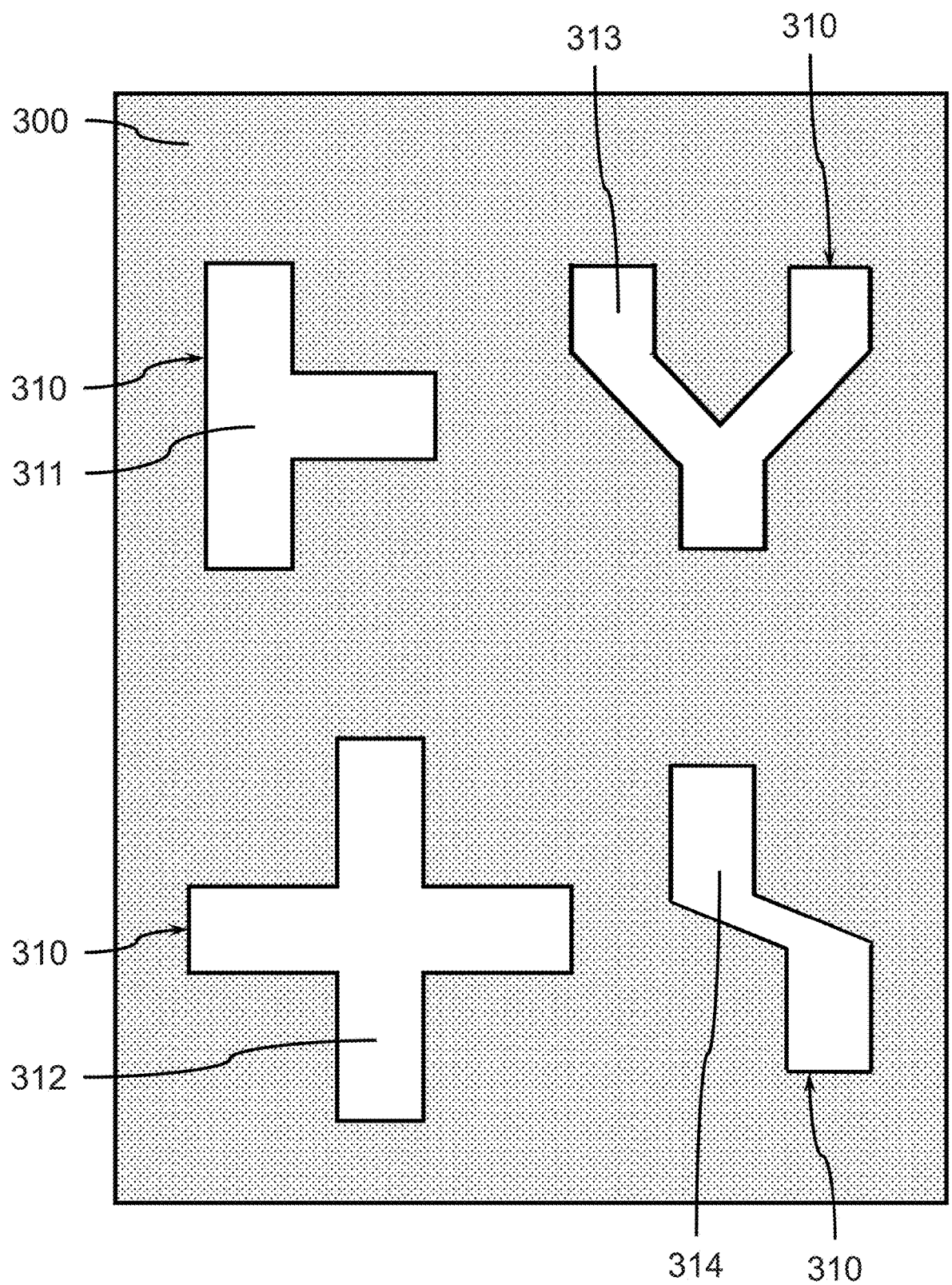
FIG. 16 shows reticle patterns for forming the compound shaped merged via openings having a T-shape, +-shape, V-shape, or Z-shape, in accordance with an embodiment of the present invention.

FIG. 16 shows reticle patterns for forming the compound shaped merged via openings having a T-shape, +-shape, V-shape, or Z-shape, in accordance with an embodiment of the present invention.

In one or more embodiments, a merged via pattern 310 can be printed on a reticle 300 (i.e., photolithographic mask) for forming a merged via opening 210 in a via mask layer 160, where the merged via pattern 310 can have a compound shape, for example, an orthogonal or non-orthogonal shape, for example, a T-shape 311, +-shape 312, V-shape (Y-shape) 313, or Z-shape 314. The design shape(s) 311, 312, 313, 314 to be formed on the photolithographic mask can be converted into the appropriate format (e.g., GDSII) for the fabrication of the photolithographic masks. The photolithographic masks can be utilized to define areas of the wafer and/or the via mask layer 160 thereon to be developed, etched, or otherwise processed. Each merged via pattern 310 can correspond to an intended merged via opening 210.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a merged via, comprising:
   forming a plurality of metal lines in a first metallization layer on a substrate, wherein each adjacent pair of metal lines is separated by a dielectric line;
   forming a cap layer on each dielectric line, wherein a top surface of the cap layer is coplanar with top surfaces of the plurality of metal lines;
   forming a dielectric layer on the plurality of metal lines in the first metallization layer and cap layers;
   forming a hard mask layer on the dielectric layer;
   forming a plurality of trench templates on the hard mask layer;
   forming a via mask layer on the plurality of trench templates; and
   forming a merged via opening in the via mask layer, wherein the via mask opening includes a compound shape having a first rectangular opening portion and a second rectangular opening portion that intersect at an angle in the plane of a top surface of the via mask layer.

2. The method of claim 1, wherein the compound shape is a shaped selected from the group consisting of a T-shape, +-shape, V-shape, and Z-shape, wherein the compound shape has rounded inside corners, and wherein the rounded inside corners are not located directly above the plurality of metal lines in the first metallization layer.

3. The method of claim 2, further comprising removing a portion of the hard mask layer exposed by the merged via opening and between edges of adjacent trench templates.

4. The method of claim 3, further comprising removing a portion of the dielectric layer exposed by the removed portion of the hard mask, merged via opening, and between the edges of adjacent trench templates, wherein removing the exposed portion of the dielectric layer forms at least one trench and at least one via opening to at least one of the plurality of metal lines in the first metallization layer.

5. The method of claim 4, further comprising removing the via mask layer and trench templates.

6. The method of claim 5, further comprising forming a conductive material in the at least one trench and at least one via opening to form one or more metal lines in the dielectric layer, and one or more vias between at least one of the plurality of metal lines in the first metallization layer and at least one of the one or more metal lines in the dielectric layer.

7. The method of claim 6, wherein the conductive material is copper or cobalt.

8. The method of claim 7, wherein the substrate includes at least one semiconductor device electrically connected to at least one of the plurality of metal lines in the first metallization layer.

9. A method of forming a merged via, comprising:
forming a plurality of metal lines in a first metallization layer on a substrate, wherein each adjacent pair of metal lines is separated by a dielectric line;
forming a cap layer on each dielectric line, wherein a top surface of the cap layer is coplanar with top surfaces of the plurality of metal lines;
forming a dielectric layer on the plurality of metal lines in the first metallization layer and cap layers;
forming a hard mask layer on the dielectric layer;
forming a plurality of trench templates on the hard mask layer that are orthogonal to the underlying cap layers, wherein the plurality of trench templates are configured to align a via etched into the dielectric layer with the underlying orthogonal cap layers;
forming a via mask layer on the plurality of trench templates; and
forming a merged via opening in the via mask layer, wherein the via mask opening includes a compound shape having a first rectangular opening portion and a second rectangular opening portion that intersect at an angle, wherein at least portions of two of the plurality of trench templates and a portion of the hard mask layer are exposed by the merged via opening.

10. The method of claim 9, further comprising forming a sacrificial plug on each of the plurality of metal lines.

11. The method of claim 10, further comprising recessing the plurality of metal lines, wherein the sacrificial plugs are formed on the recessed metal lines.

12. The method of claim 11, wherein the plurality of trench templates are formed from a trench template layer formed on the hard mask layer, and wherein the trench template layer is selectively etchable relative to the hard mask layer, first dielectric layer, sacrificial plugs, and metal lines.

13. The method of claim 12, wherein the compound shape is a shaped selected from the group consisting of a T-shape, +-shape, V-shape, and Z-shape, wherein the compound shape has rounded inside corners, and wherein the rounded inside corners are not located directly above the plurality of metal lines in a first metallization layer.

14. The method of claim 12, further comprising removing a portion of the hard mask layer exposed by the merged via opening and between edges of adjacent trench templates.

15. A method of forming a merged via, comprising:
forming a cap layer on each dielectric line in an alternating arrangement of parallel metal lines and dielectric lines, such that each adjacent pair of metal lines is separated by a dielectric line, wherein a top surface of the cap layer is coplanar with top surfaces of the plurality of metal lines;
recessing each of the metal lines below the cap layer;
forming a dielectric layer on the cap layers and alternating arrangement of metal lines and dielectric lines;
forming a hard mask layer on the dielectric layer;
forming a plurality of trench templates on the hard mask layer that are orthogonal to the underlying cap layers;
forming a via mask layer on the plurality of trench templates; and
forming a merged via opening in the via mask layer, wherein the via mask opening includes a compound shape having a first rectangular opening portion and a second rectangular opening portion that intersect at an angle in the plane of a top surface of the via mask layer.

16. The method of claim 15, wherein the compound shape is a shaped selected from the group consisting of a T-shape, +-shape, \T-shape, and Z-shape, wherein the compound shape has rounded inside corners, and wherein the rounded inside corners are not located directly above the plurality of metal lines in a first metallization layer.

17. The method of claim 16, further comprising forming a sacrificial plug on each of metal lines.

18. The method of claim 17, wherein the trench template layer 150 is a dielectric material selected from the group consisting of silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), boron carbide (BC), boron nitride (BN), and combinations thereof.

19. The method of claim 17, wherein the trench templates and portions of the hard mask layer are exposed through the merged via opening, such that the merged via opening, trench templates, and cap layer are configured to form two or more self-aligned or fully aligned vias.

20. The method of claim 17, wherein the plurality of trench templates are configured to align a via etched into the dielectric layer with underlying orthogonal cap layers, and wherein the trench templates are selectively etchable relative to the hard mask layer, first dielectric layer, sacrificial plugs, and metal lines.

* * * * *